(12) United States Patent
Farooq et al.

(10) Patent No.: US 11,315,831 B2
(45) Date of Patent: Apr. 26, 2022

(54) DUAL REDISTRIBUTION LAYER STRUCTURE

(71) Applicant: INTERNATIONAL BUSINESS MACHINES CORPORATION, Armonk, NY (US)

(72) Inventors: Mukta G. Farooq, Hopewell Junction, NY (US); James J. Kelly, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 157 days.

(21) Appl. No.: 16/518,166

(22) Filed: Jul. 22, 2019

(65) Prior Publication Data

US 2021/0028061 A1    Jan. 28, 2021

(51) Int. Cl.
    *H01L 21/768*      (2006.01)
    *H01L 23/538*      (2006.01)
    *H01L 25/00*      (2006.01)
    *H01L 25/065*      (2006.01)

(52) U.S. Cl.
CPC .. *H01L 21/76877* (2013.01); *H01L 21/76802* (2013.01); *H01L 21/76843* (2013.01); *H01L 21/76873* (2013.01); *H01L 23/5384* (2013.01); *H01L 23/5385* (2013.01); *H01L 23/5386* (2013.01); *H01L 25/0655* (2013.01); *H01L 25/50* (2013.01)

(58) Field of Classification Search
CPC ......... H01L 21/76802; H01L 21/76877; H01L 23/5386
See application file for complete search history.

(56) References Cited

U.S. PATENT DOCUMENTS

| | | | |
|---|---|---|---|
| 3,648,131 A * | 3/1972 | Stuby | ................ H01L 21/76898 257/622 |
| 5,384,955 A | 1/1995 | Booth et al. | |
| 5,753,536 A | 5/1998 | Sugiyama et al. | |
| 6,367,472 B1 | 4/2002 | Koch et al. | |
| 6,448,174 B1 | 9/2002 | Ramm | |
| 6,645,832 B2 | 11/2003 | Kim et al. | |
| 6,949,412 B2 | 9/2005 | Saijo et al. | |

(Continued)

FOREIGN PATENT DOCUMENTS

| CN | 106887393 B | 3/2017 |
|---|---|---|
| JP | 4286965 B2 | 5/1999 |

*Primary Examiner* — Kenneth Parker
*Assistant Examiner* — Long H Le
(74) *Attorney, Agent, or Firm* — Tutunjian & Bitetto, P.C.; Abdy Raissinia

(57) ABSTRACT

A method for fabricating a dual redistribution layer (RDL) interposer structure is provided. The method includes etching a semiconductor substrate to expose natural crystallographic planes to form trenches. The method also includes depositing conductive material within the trenches of the etched semiconductor substrate to form vias for an interposer structure. The method includes placing back end of line (BEOL) inter-chip wiring on a top side of the interposer structure using a first RDL. The method includes exposing the vias on a back side of the interposer structure. The method further includes forming power RDLs on a back side of the interposer structure using conductive lines in a dielectric layer.

5 Claims, 11 Drawing Sheets

(56) References Cited

U.S. PATENT DOCUMENTS

| | | | |
|---|---|---|---|
| 6,982,225 | B2 | 1/2006 | Bohr |
| 9,418,877 | B2 | 8/2016 | Gu et al. |
| 9,601,410 | B2 | 3/2017 | Tsai et al. |
| 9,620,437 | B2 | 4/2017 | Oganesian et al. |
| 9,748,167 | B1 | 8/2017 | Lin |
| 10,157,864 | B1 | 12/2018 | Yu et al. |
| 11,011,451 | B2 * | 5/2021 | Chiu .................... H01L 23/5384 |
| 2007/0020805 | A1 | 1/2007 | Kim et al. |
| 2009/0057689 | A1 * | 3/2009 | Yamamoto ............ H01L 33/343 |
| | | | 257/86 |
| 2019/0115311 | A1 * | 4/2019 | Yu ........................... H01L 24/20 |
| 2019/0333871 | A1 * | 10/2019 | Chen ..................... H01L 21/568 |
| 2020/0035604 | A1 * | 1/2020 | Rubin ..................... H01L 23/12 |
| 2020/0402942 | A1 * | 12/2020 | Chen ....................... H01L 24/96 |

\* cited by examiner

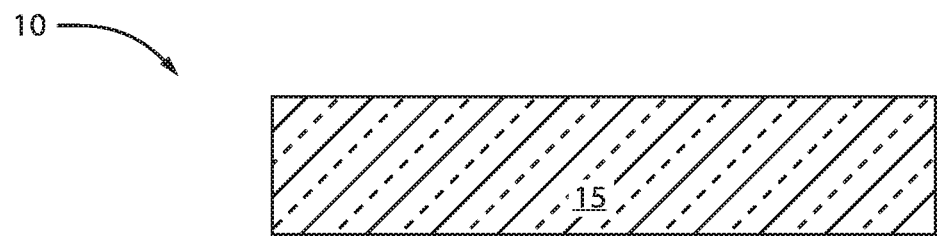
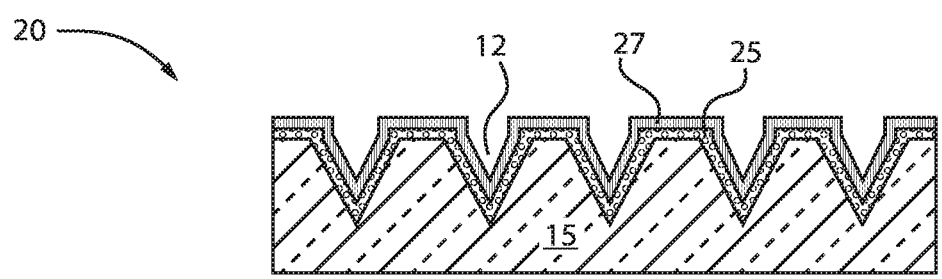
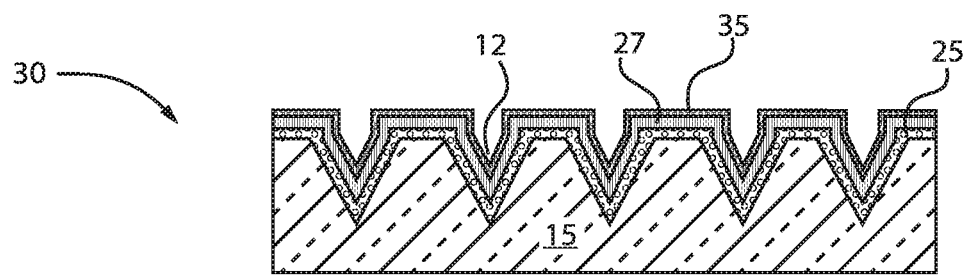
FIG. 1

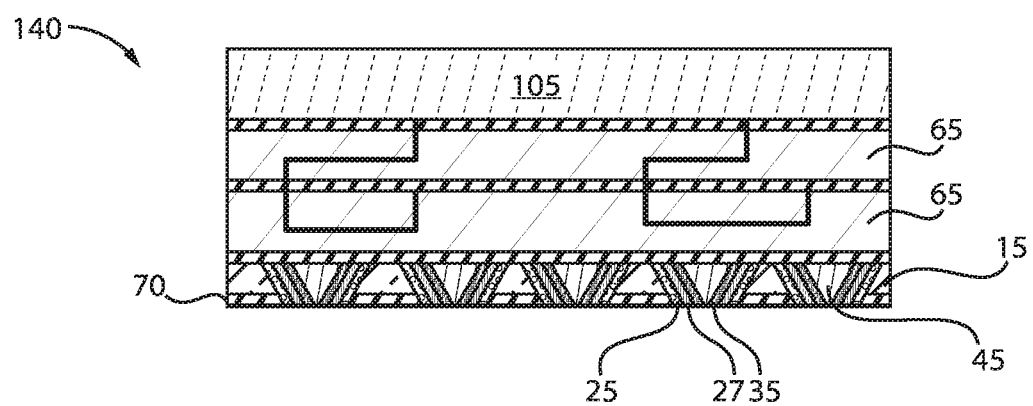
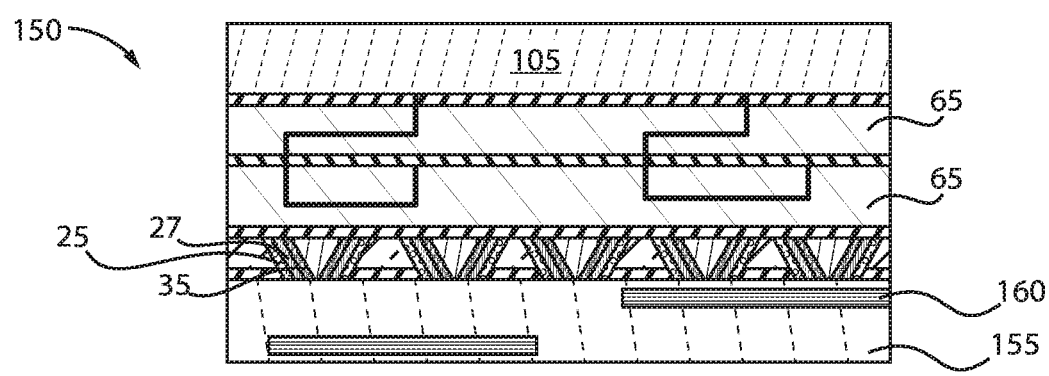
FIG. 6

400

410  420  430  440

| Width of Mask Opening (um) | Depth of Si etch (um) | Undercut (um) (TMAH) | Undercut (um) (KOH) |
|---|---|---|---|
| 25 | 18 | 1 | 0.1 |
| 50 | 35 | 2 | 0.2 |
| 75 | 53 | 4 | 0.3 |
| 100 | 71 | 5 | 0.4 |
| 150 | 105 | 7 | 0.6 |

FIG. 9

| Feature | Standard Laminate | Advanced Laminates | Interposer with TSV's | Dual RDL interposed with wet etched vias |
|---|---|---|---|---|
| Line/Space | ~10-15 um L/S | 2-5 um L/S | Sub-micron | Sub-micron |
| Cu Thickness | 15 um | 2 um | Sub-micron | Sub-micron |
| uVia Diameter | ~40-65 um | 10 um | Sub-micron (between dielectric levels)/~5-10um (connection to substrate) | Sub-micron (between dielectric levels)/~25-100um (connection to substrate) |
| Processing location | Non-Si fab | Non-Si fab | Si fab | Si fab at reduced cost due to wet etching |
| Power delivery/ distribution | RDL | RDL | RDL, but vertically through TSV | RDL, vertically through etched lower cost vias |

FIG. 10

DUAL REDISTRIBUTION LAYER STRUCTURE

BACKGROUND

The present invention generally relates to semiconductors, and more particularly to structures for power-carrying and inter-chip transmission.

High speed and high bandwidth communication is useful in many high performance computing applications. High speed and high bandwidth communication sometimes is needed to permit artificial intelligence (AI) applications and workloads.

SUMMARY

In accordance with an embodiment of the present invention, a method for fabricating a dual redistribution layer (RDL) interposer structure is provided. The method includes etching a semiconductor substrate to expose natural crystallographic planes to form trenches. The method also includes depositing conductive material within the trenches of the etched semiconductor substrate to form vias for an interposer structure. The method includes placing back end of line (BEOL) inter-chip wiring on a top side of the interposer structure using a first RDL. The method includes exposing the vias on a back side of the interposer structure. The method further includes forming power RDLs on a back side of the interposer structure using conductive lines in a dielectric layer.

In accordance with an embodiment of the present invention, a device including a dual redistribution layer (RDL) interposer structure for power-carrying and inter-chip transmission is provided. The device includes an interposer structure with vias formed along natural crystallographic planes. The device also includes a back end of line (BEOL) fine inter-chip wiring with high density interconnects formed in an inorganic dielectric layer. The BEOL is configured for communication on a top side of the interposer structure. The device also includes power RDL on a back side of the interposer structure including conductive lines in a dielectric layer.

In accordance with an embodiment of the present invention, a device including a dual redistribution layer (RDL) interposer structure for power-carrying and inter-chip transmission is provided. The device includes a high bandwidth memory component, and an accelerator. The device also includes a back end of line build in an inorganic RDL, thinned silicon with conductive material filled wet etched tetrahedral vias, and an organic RDL including thick wiring for power carrying.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 1 illustrates cross-sectional views showing stages of forming a fine redistribution layer (RDL) with thick power carrying RDL including wet etch and thermal oxide deposition, and conductive barrier seeding, in accordance with embodiments of the present invention;

FIG. 6 illustrates cross-sectional views showing stages of forming a fine RDL with thick power carrying RDL including CMP for via reveal and organic RDL deposition and metallization, in accordance with embodiments of the present invention;

FIG. 9 illustrates a table of expected dimensions for dielectric wet etch, in accordance with an embodiment of the present invention;

FIG. 10 illustrates a table comparing various approaches for achieving high density chip-to-chip interconnects.

DETAILED DESCRIPTION

Figure 2:
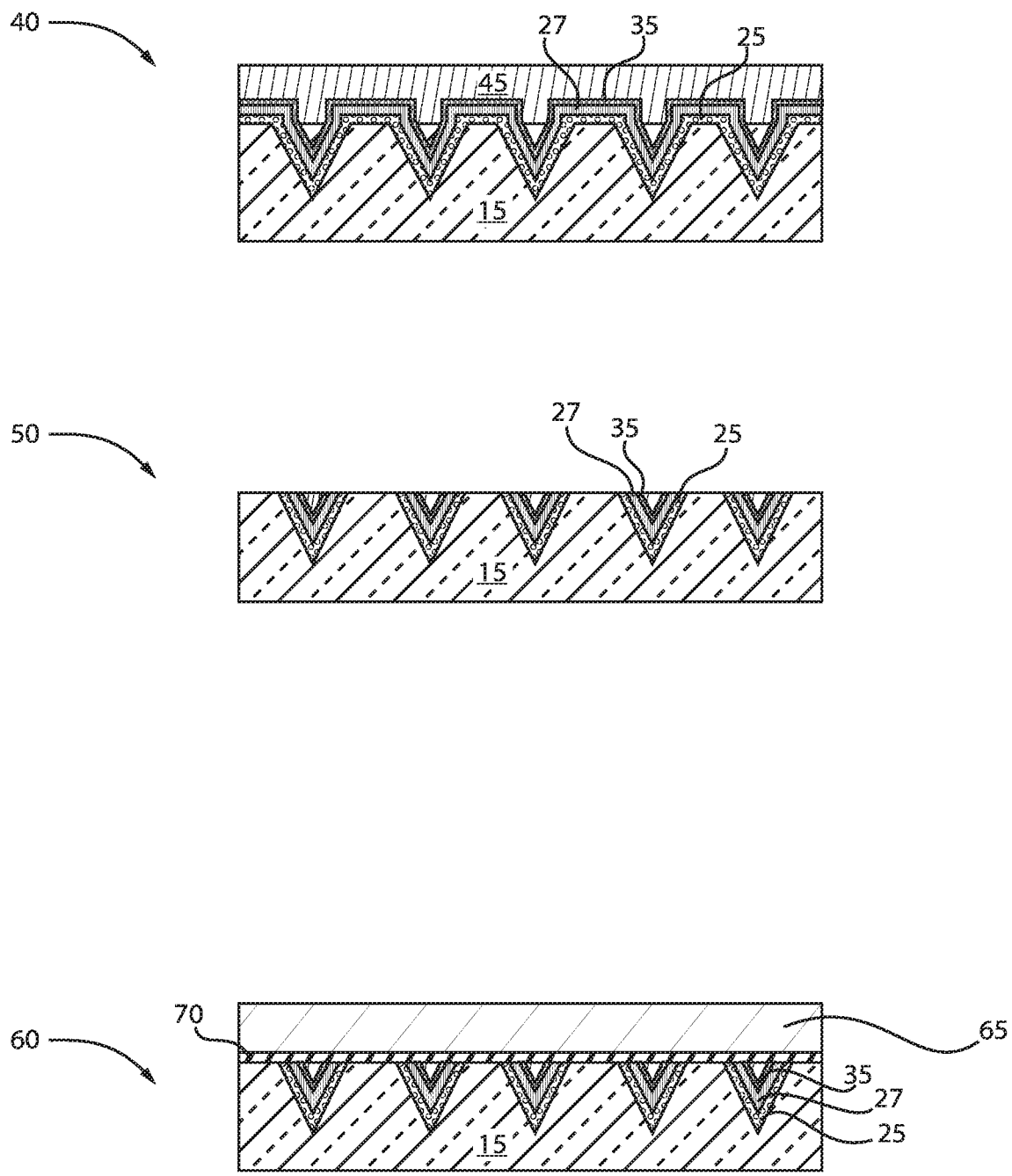
FIG. 2 illustrates cross-sectional views showing stages of forming a fine RDL with thick power carrying RDL including conductive plate annealing, chemical mechanical planarization (CMP) and nitrogen doped copper (Cu) diffusion barrier and oxide deposition, in accordance with embodiments of the present invention.

Embodiments of the present invention relate generally to providing a dual redistribution layer (RDL) for multiple die attached to a single packaging substrate. The dual RDL interposer structure can be implemented for power-carrying and inter-chip transmission. An interposer is an electrical interface routed between one connection or socket to another. In example embodiments, neither Bosch (an anisotropic deep silicon plasma etching process) etch nor (any form of) deep reactive ion etching (RIE) is needed (or used) to form the interposer. Instead, in example embodiments, the interposer structure can be fabricated using wet chemistry for via etching along natural crystallographic planes. The example embodiments include a semiconductor (for example, silicon (Si)) interposer with wet etched vias, filled with a conductor (for example, a conductive material), for example, copper (Cu). The example embodiments can include RDL on a back side of the interposer (for example, a laminate side). In some instances, the embodiments can include multiple RDLs that can be split up in groups of chips where inter-chip communication is needed (and/or implemented). In the example embodiments, the structures are fabricated to include back end of line (BEOL) fine inter-chip wiring (for example, sub-micron to up to a few (e.g., 1-2) microns, etc.), using, e.g., an inorganic dielectric layer, for communication on top side.

Embodiments of the present invention also relate generally to providing fine wiring for high speed and high bandwidth inter-chip communication, and thicker/wider (in an example embodiment 1 to 10 microns, in further embodiments above 10 microns, etc.) conductive (for example, Cu) lines for power delivery and redistribution. In contrast to Si interposers with through-silicon vias (TSVs) which have significant costs due to TSV processing in the fabrication and limited extendibility due to reticle size limits for the interposer, the example embodiments do not limit reticle size for the interposer and consequently have greater (for example, unlimited) extendibility. The example embodiments can include a silicon interposer with wet etched vias, filled with a conductor (conductive material), such as Cu. In contrast to (Cu/polymer) RDLs which may be made on a semiconductor (for example, Si) wafer and then transferred to the packaging substrate (using an attach and then a thinning process) and often need an additional bridge for inter-chip transmission, the example embodiments provide for inter-chip transmission (without any additional bridges).

Exemplary applications/uses to which the present invention can be applied include, but are not limited to providing a structure for high speed and high bandwidth inter-chip communication with thicker/wider conductive lines for power delivery and redistribution.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

It should be noted that materials may be referred to only by their composition constituent, e.g., silicon, nitrogen, oxygen, carbon, hafnium, titanium, etc., without specifying a particular stoichiometry (e.g., SiGe, $SiO_2$, $Si_3N_4$, $HfO_2$, etc.) in recognition that the stoichiometry can vary based on formation processes, processing parameters, intentional non-stoichiometric fabrication, deposition tolerance, etc. Reference to only the composition constituents (e.g., SiO, SiN, TiN, etc.) is, therefore, intended to refer to all suitable stoichiometric ratios for the identified composition. In addition, other elements can be included in the compound and still function in accordance with the present principles. The compounds with additional elements will be referred to herein as alloys.

It should also be understood that material compounds will be described in terms of listed elements, e.g., SiGe. These compounds include different proportions of the elements within the compound, e.g., SiGe includes $SixGe_{1-x}$, where x is less than or equal to 1, etc.

It is to be understood that aspects of the present invention will be described in terms of a given illustrative architecture; however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

FIGS. 1 to 4 collectively and sequentially illustrate an example embodiment of processes that may be implemented for fabricating a dual redistribution layer (RDL) for multiple die attached to a single packaging substrate. The processes described with respect to FIGS. 1 to 4 achieve this by processes including wet etch, oxide deposition, electroplating and fabrication (formation, positioning, etc.) of fine wiring.

Referring now to the drawings in which like numerals represent the same or similar elements and initially to FIG. 1, there are shown cross-sectional views of stages of forming a fine redistribution layer (RDL) with thick power carrying RDL including providing an initial semiconductor substrate (for example, a wafer) (fabrication stage 10), wet etch and thermal oxide deposition, (fabrication stage 20), and conductive barrier seeding (fabrication stage 30), in accordance with example embodiments.

As shown in FIG. 1, an initial semiconductor wafer 15 (for example, silicon, germanium, etc.) is provided in fabrication stage 10. The anisotropy of the wet etch in silicon can be more pronounced in silicon when compared to wet etch in germanium.

At the next fabrication stage 20, trenches (for example, that are used to form vias 12) are etched into the semiconductor wafer 15 along natural crystallographic planes of the semiconductor substrate. Crystallographic planes are included in structures known as crystal lattices. Crystal lattices are three dimensional (3D) patterns that consist of symmetrically organized atoms intersecting three sets of parallel planes. These parallel planes are "crystallographic planes" and are used to determine the shape and structure of the unit cell and crystal lattice. The crystallographic planes intersect with each other and form 3D shapes that can have six faces. The etch rates for different planes in the crystal lattice differ and so trenches can be formed in particular directions along the natural crystallographic planes. This etch can include a wet chemistry such as, for example, silicon wet etch, as described herein below with respect to FIGS. 1 and 8. Other forms of etch can be used, based on considerations of cost, precision and efficiency. For example, vapor phase etching or other processes can be employed to etch the vias along natural crystallographic planes. The vias 12 can be formed in a suitable geometric pattern, for example, a tetrahedral pattern, a hexagonal pattern, a rhomboid pattern, a circular pattern, etc.

After formation of the vias 12 using chemical etchants (not RIE or Bosch etching) for via etching along natural crystallographic planes, a liner layer 25 (for example, a (e.g., thin) oxide layer) and a barrier layer 27 is added to the structure. The liner layer 25 can be added by appropriate process, such as, with regard to oxide layers, oxide deposition or thermal oxidation (for example, approximately nominal 1 um, etc.). The barrier layer 27 can include tantalum or titanium-based materials (e.g., in the case of tantalum nitride materials (e.g., TaN) in a TaN/Ta bilayer or a single layer of TaN or Ta), for example, by PVD with sufficient thickness to prevent Cu diffusion.

At fabrication stage 30, a conductive material (for example, Cu) seed layer 35 is applied to the structure by any suitable process, such as, e.g., ALD, CVD, metal-organic CVD (MOCVD), physical vapor deposition (PVD), combinations thereof, or other suitable techniques. The conductive material barrier 35 can continuously cover the liner layer 25. The conductive material 35 can be used to form conductive interconnects.

Referring now to FIG. 2, there are shown cross-sectional views showing stages of forming a fine RDL with thick power carrying RDL including conductive plating and annealing (fabrication stage 40), planarization (fabrication stage 50), for example, chemical mechanical planarization (CMP), and application of an inorganic mask (for example, a silicon nitride film or other nitrogen-containing dielectric films) and dielectric layer (for example, oxide) deposition (fabrication stage 60), in accordance with example embodiments.

At fabrication stage 40, a conductive plate 45 (for example, a Cu plate) is added to the structure and annealed. For example, an electroplating process (using, for example, Cu) can be applied to the structure. Alternatively, another suitable process of adding conductive material can be applied to add and anneal the conductive plate 45.

At fabrication stage 50, chemical mechanical planarization (CMP) (stopping on the silicon 15) is performed to remove the conductive barrier 45. The (for example, thin) liner layer 25 and seed layer 35 are removed at the upper horizontal surface of the silicon 15, exposing the semiconductor 15. Conductive material 45 (with liner layer 25 and seed layer 35) remains in the vias 12.

At fabrication stage 60, an inorganic barrier and etch stop film (or mask) layer 70 and a dielectric layer 65 (for example, an oxide layer) are deposited (covering the upper surface of the structure, including the conductive material (for example, copper deposits) in the vias).

Figure 3:
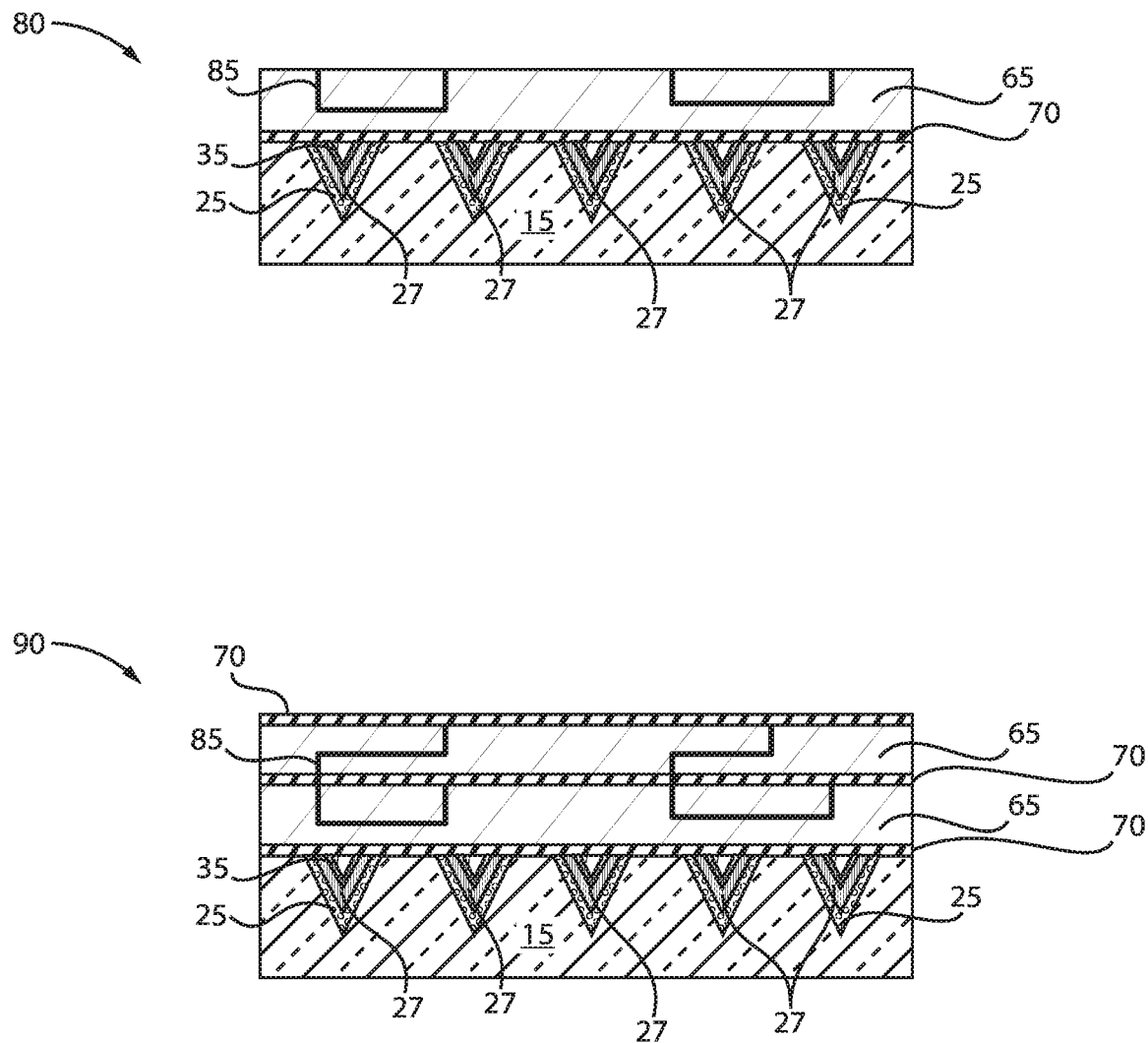
FIG. 3 illustrates cross-sectional views showing stages of forming a fine RDL with thick power carrying RDL including back end of line (BEOL) semiconductor device fabrication for a first and second RDL portion, in accordance with embodiments of the present invention.

Referring now to FIG. 3, there are shown cross-sectional views showing stages of forming a fine RDL with thick power carrying RDL including back end of line (BEOL) semiconductor device fabrication for a first and second RDL portion, in accordance with example embodiments.

At fabrication stage 80, the process includes adding an inorganic dielectric. A back end of line (BEOL) 85 interconnect layer can be added to the inorganic dielectric layer 65 (for example, an oxide or low K dielectric layer). According to an embodiment of the present invention, fine BEOL wiring 85 can be formed in (for example, within) the inorganic dielectric layer RDL. A copper planarization process (for example, damascene of the inlay) can also be performed (for example, to form interconnects and shape the (for example, intricate) patterns of the conductive material). The wires thereby formed can be used in the completed structure for inter-chip communication. The BEOL 85 is formed as fine inter-chip wiring, using an inorganic dielectric layer 65, for communication on a top side of the structure. The conductive lines of wiring can form a BEOL interconnect layer 85. The BEOL 85 can be formed from a conductive material, such as, for example, a metal or metal alloy, a conductive oxide, a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. According to an embodiment of the present invention, the conductive lines 130 are formed from a metal, such as, for example, tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), gold (Au) or other metals and alloys thereof. In an example embodiment, the conductive interconnect wiring can be cladded with a metal diffusion layer to prevent the movement of the conductive metal into the dielectric layer 65.

At fabrication stage 90, the process includes adding another nitride Cu diffusion layer 70 and repeating the process of fabrication stage 80 according to manufacturer specifications to create additional (for example, 1, 2 or more) layers of fine (BEOL) wiring 85. Although a single additional dielectric layer 65 is illustrated, it should be understood that multiple additional layers of the BEOL 85 can be formed. It is understood that, before application of the nitride layer, the top-most level of BEOL wiring may be terminated with either Cu or gold "capture pads" that will accept chips that will be bonded to the BEOL wiring level at a later time.

Figure 4:
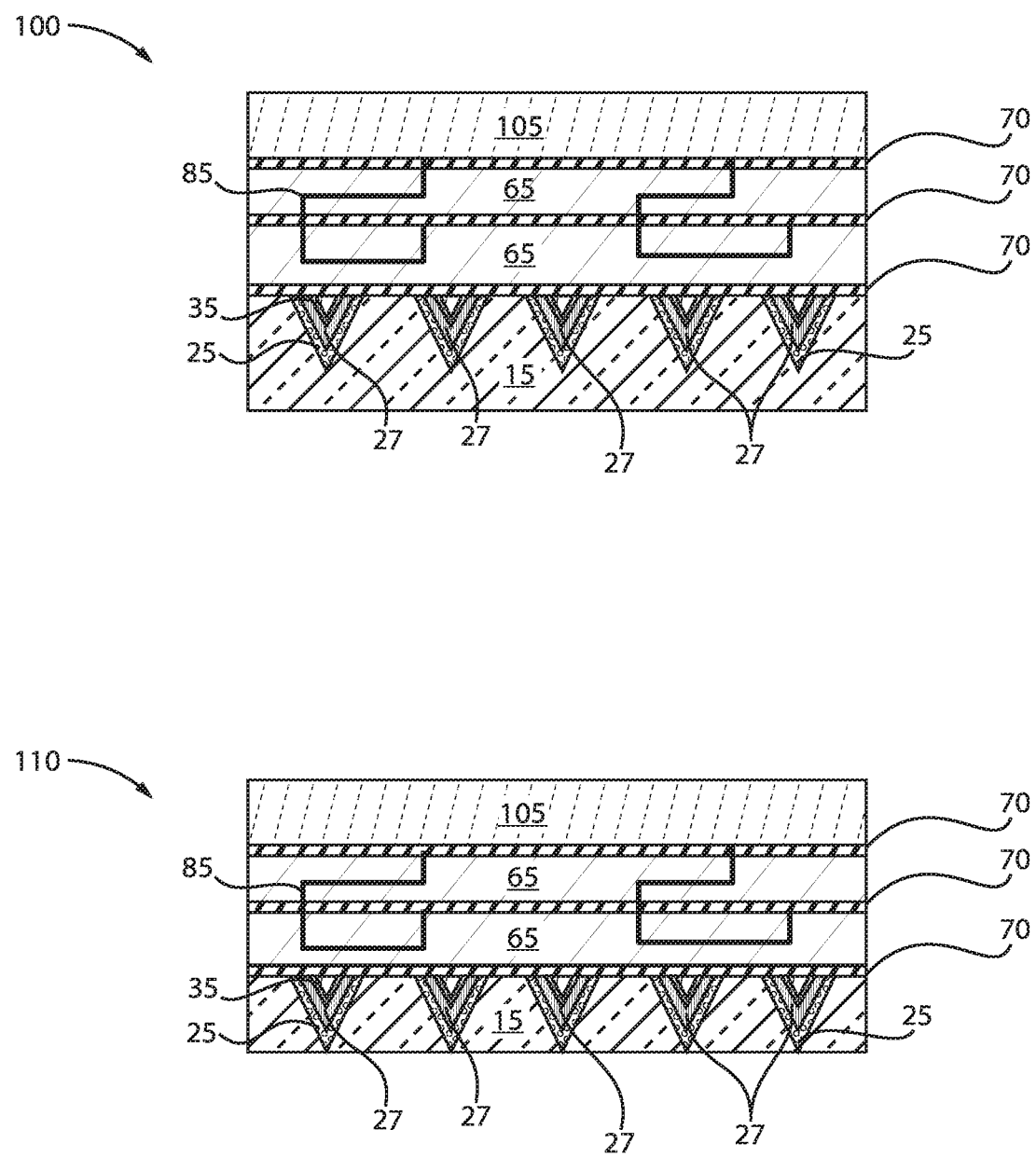
FIG. 4 illustrates cross-sectional views showing stages of forming a fine RDL with thick power carrying RDL including attachment of a temporary carrier and grind down to oxide layer, in accordance with embodiments of the present invention.

Referring now to FIG. 4, there are shown cross-sectional views showing stages of forming a fine RDL with thick power carrying RDL including attachment of a temporary carrier and grind down to oxide layer, in accordance with example embodiments.

At fabrication stage 100, a first (temporary) carrier 105 is attached to (the top side of the) structure. The carrier 105 can include a glass or Si carrier, which is attached to the surface of the structure.

At fabrication stage 110, the semiconductor layer 15 is ground down to the liner layer 25 (from the bottom position in the perspective of FIG. 4). For example, the manufacturer can grind a semiconductor base (for example, silicon) down to the liner layer (for example, a thin oxide). The backside is thinned (for example, cut down, reduced, etc.). The amount of thinning applied to the structure will depend on how much etching was done (at fabrication stage 20, described herein above with respect to FIG. 1) which in turn depends on pitch (because the manufacturing process has to stop etching to leave enough gap between adjacent (for example, tetrahedron, rhomboid, geometric, etc.) vias 12).

Figure 5:
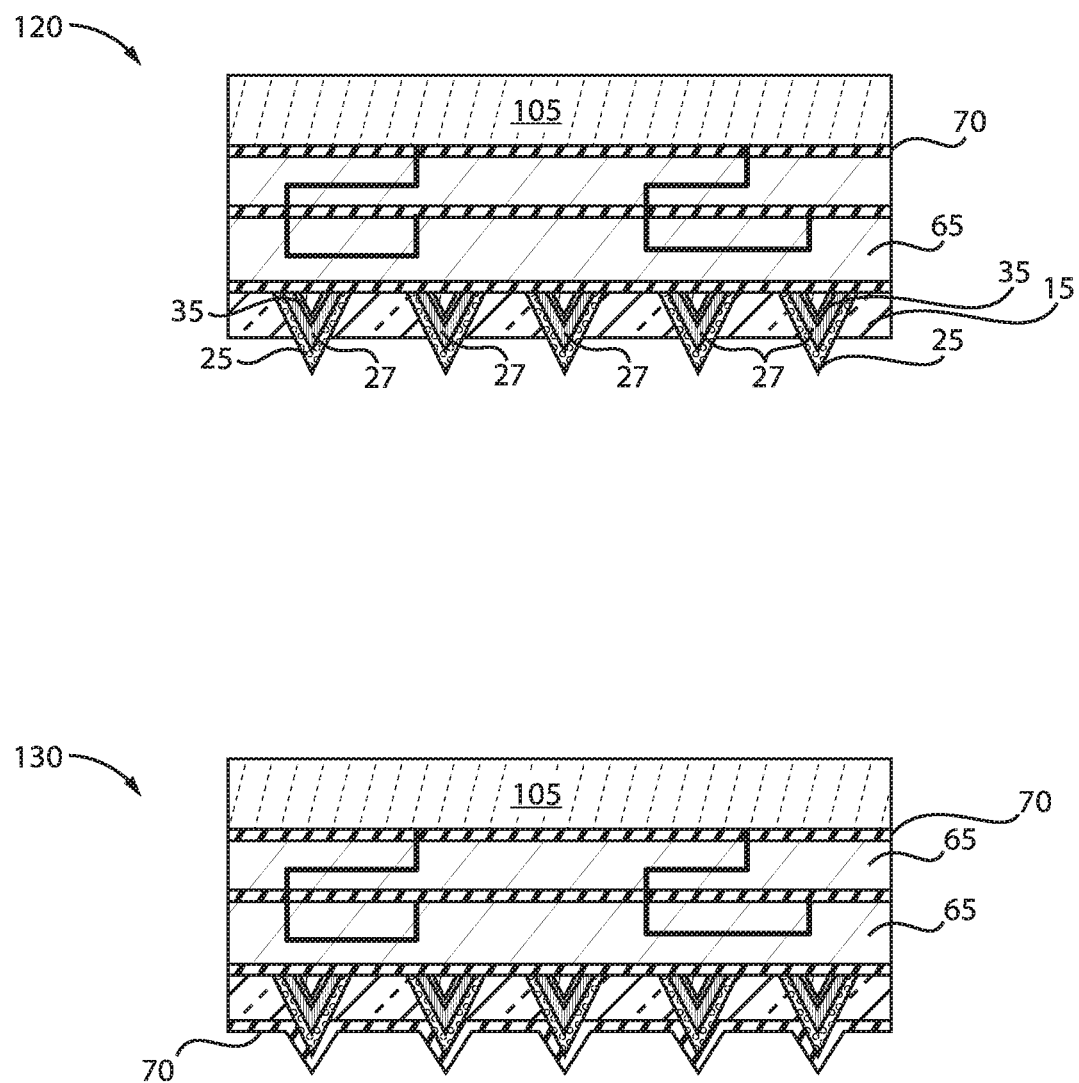
FIG. 5 illustrates cross-sectional views showing stages of forming a fine RDL with thick power carrying RDL including dielectric reactive ion etching (RIE), nitride and oxide deposition, in accordance with embodiments of the present invention.

Referring now to FIG. 5, there are shown cross-sectional views of stages of forming a fine RDL with thick power carrying RDL including dielectric reactive ion etching (RIE), and mask and barrier deposition, in accordance with example embodiments.

At fabrication stage 120, RIE of the (for example, last few microns of) remaining silicon is performed. The silicon is removed by RIE so that (for example, little, small, etc.) peaks of conductive material (for example, Cu) covered by oxide are exposed.

At fabrication stage 130, a dielectric Cu diffusion barrier layer 70 (for example, a silicon nitride (SiN) or some other nitrogen-containing dielectric layer) is deposited (covering the bottom surface of the structure, including the conductive material (for example, copper deposits) in the vias); in some embodiments, the dielectric layer covering the revealed conductive material can be a bilayer of oxide (deposited first) and nitride (deposited last) (not shown in FIG. 3). The process provides a protective barrier (for example, a nitride (for example, SiN) deposit) which protects the conductive material (for example, Cu, Al, etc.) from entering the semiconductor layer (for example, Si) in the next step (fabrication stage 150).

Referring now to FIG. 6, there are shown cross-sectional views of stages of forming a fine RDL with thick power carrying RDL including CMP for via reveal and organic RDL deposition and metallization, in accordance with example embodiments.

At fabrication stage 140, planarization (for example, via CMP) for conductive (for example, Cu) via reveal is performed (with respect to FIG. 2, via size is changed to show nitride detail). The conductive via can provide surface electrical interconnection with one or more internal printed circuits insulated between dielectric layers of the substrate or body.

At fabrication stage 150, an organic RDL 155 is then deposited. In addition to the organic RDL deposit 155, the process also includes metallization. The resulting structure has the power RDL formed on the interposer back side (in some instances there can be multiple that can be split up in groups of chips where inter-chip communication is needed) using thick, wide copper lines 160 in an organic dielectric layer 155.

Figure 7:
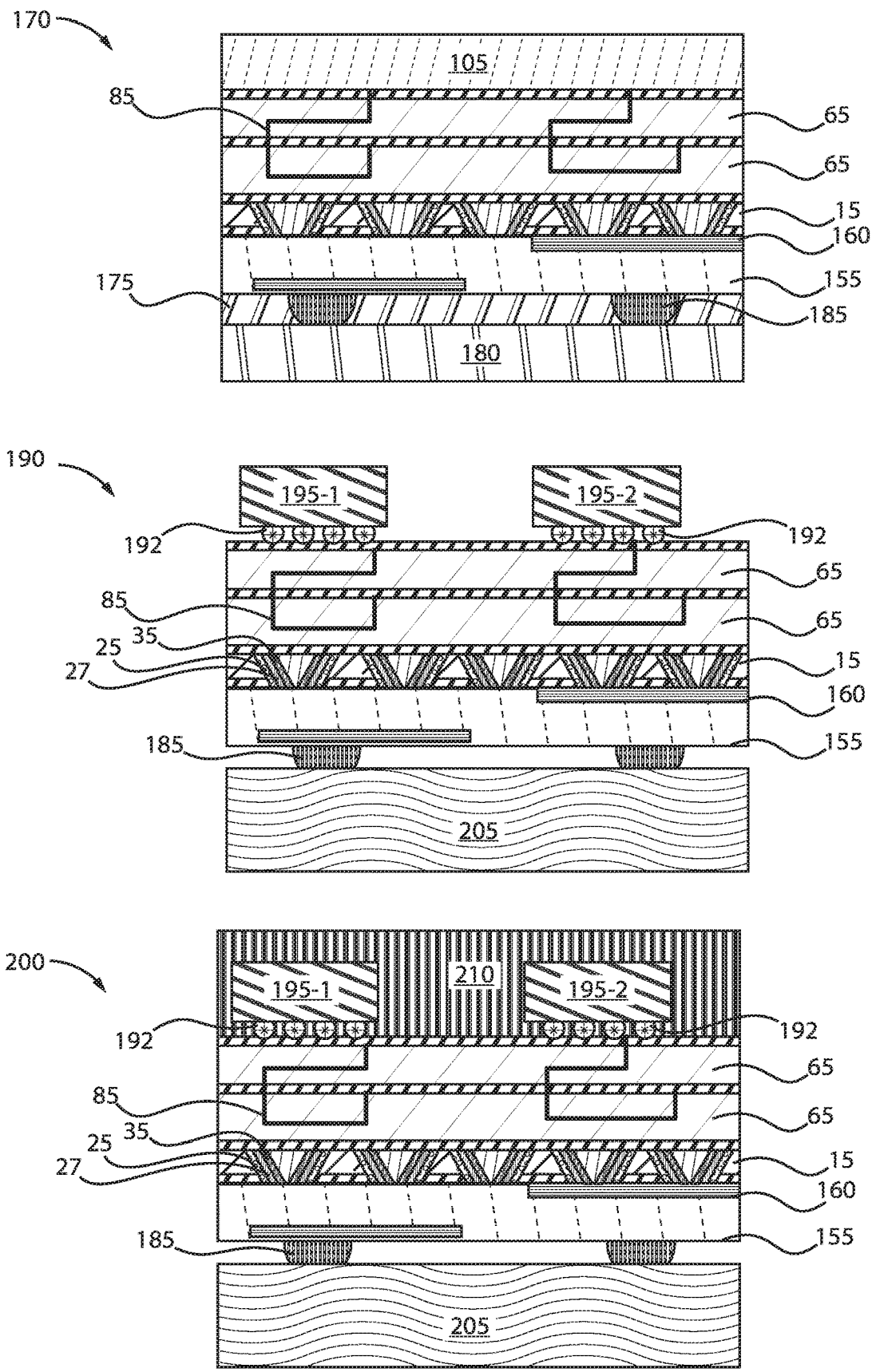
FIG. 7 illustrates cross-sectional views showing stages of forming a fine RDL with thick power carrying RDL including attachment of a second carrier, replacement of the temporary carrier with chips, and addition of an epoxy molding compound (EMC), in accordance with embodiments of the present invention.

Referring now to FIG. 7, there are shown cross-sectional views of stages of forming a fine RDL with thick power carrying RDL including attachment of a second carrier, replacement of the temporary carrier with chips, and addition of an epoxy molding compound (EMC), in accordance with example embodiments.

At fabrication stage 170, before attaching a second (temporary) carrier 180 to the structure, solder balls for controlled collapse chip connection (C4) connections are fabricated to provide for subsequent mounting for the dual RDL structure to a substrate. The carrier 180 can be attached using an adhesive or bonding material (for example, glue or other adhesive) 175 with solder balls 185 embedded in the adhesive layer.

At fabrication stage 190, the first temporary carrier 105 is removed and chips 195 are mounted on the structure using the fine BEOL wiring 85 using C4 or micro C4 connections already attached to the underside of the chips 195. In example embodiments, the exposed surface of the BEOL wiring can have capture pads with either Cu or gold surfaces (described above) to accept the incoming chips 195. According to example embodiments, the chip can then be integrated with other chips, discrete circuit elements, and/or other signal processing devices as part of either an intermediate product, such as a motherboard, or an end product.

At fabrication stage 200, one embodiment uses epoxy molding compound (EMC) 210 deposited over (or around, on top of, etc.) the chips 195. The structure is placed on dicing tape, diced, and attached to a substrate such as an organic laminate 205. In the process of manufacturing integrated circuits, wafer dicing is the process by which die are separated from a wafer of semiconductor following the processing of the wafer. The dicing process can involve scribing and breaking, mechanical sawing, laser cutting, etc. The structure includes thin silicon with through connections made by wet chemistry (not RIE or other expensive Bosch processing), and has fine wiring on top for die to die transmission, and RDL on the backside for power distribution. The resulting structure includes multiple die attached to a single packaging substrate.

Figure 8:
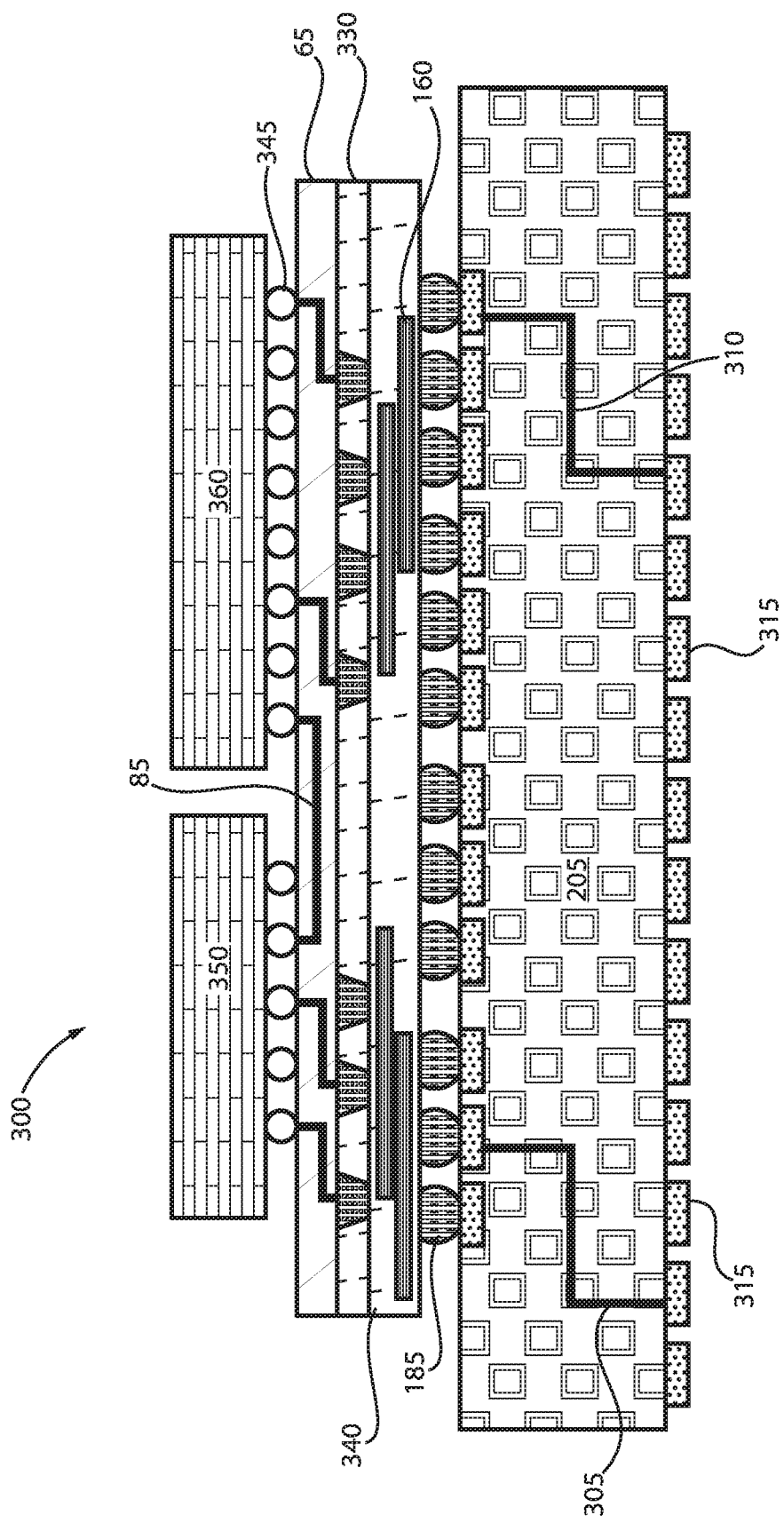
FIG. 8 illustrates cross-sectional views showing a dual RDL interposer structure for power-carrying and inter-chip transmission, in accordance with an embodiment of the present invention.
Figure 11:
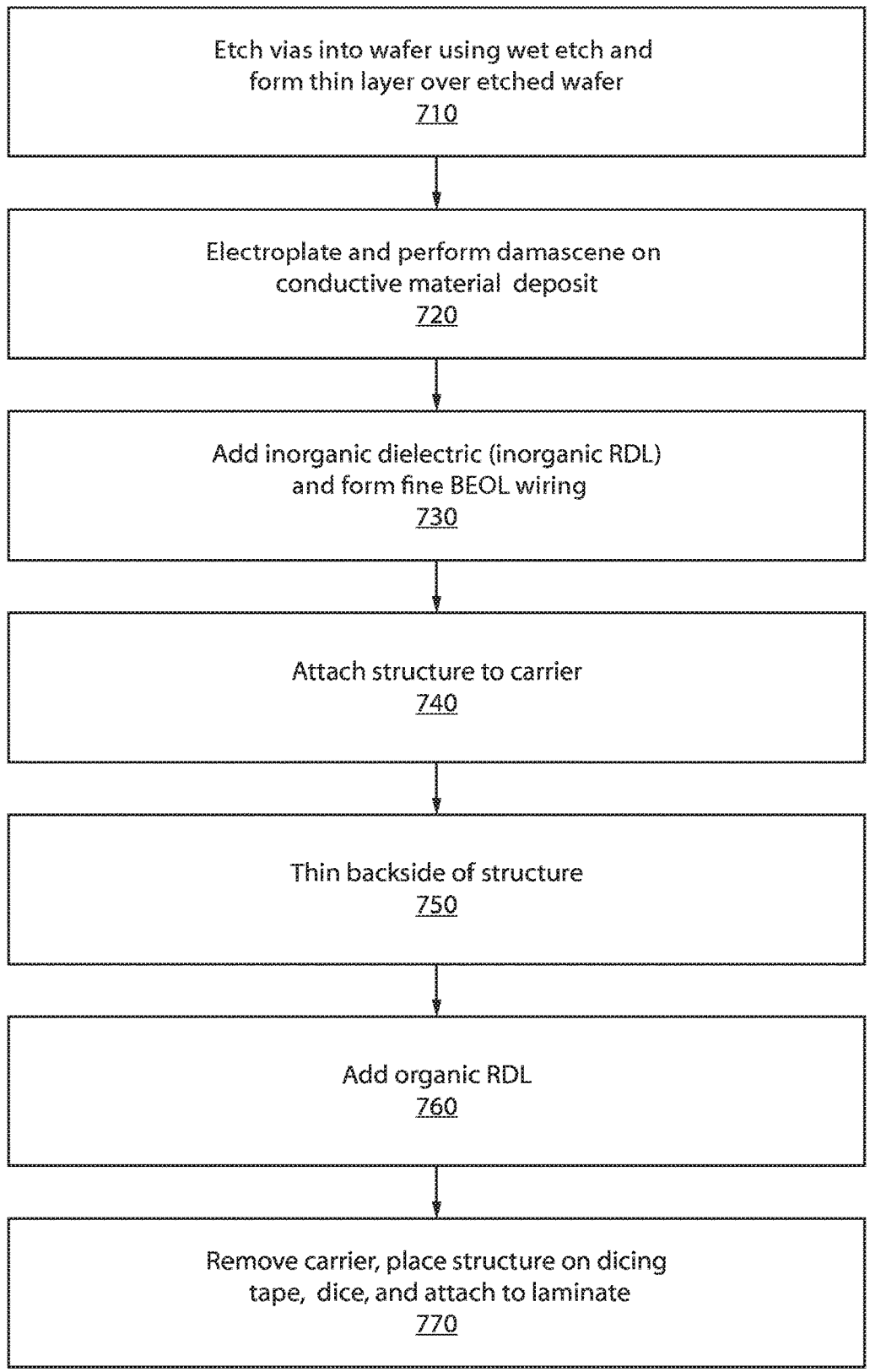
FIG. 11 is a flow diagram showing a method of fabrication of a dual RDL interposer structure, in accordance with an embodiment of the present invention.

Referring now to FIG. 8, there is illustrated a cross-sectional view showing a dual RDL interposer structure 300 for power-carrying and inter-chip transmission, in accordance with example embodiments of the present invention.

As shown in FIG. 8, dual RDL interposer structure 300 (for power-carrying and inter-chip transmission) can include a combination of logic and memory dies, such as one or more random access memory (RAM) interface for a three dimensional stacked dynamic random access memory (DRAM) components 350 (for example, high bandwidth memory (HBM)), and accelerator(s) 360, solder attachments 345, fine wiring (for example, sub-micron to 1 um or above) within an inorganic dielectric 340, a silicon interposer 330, thick (for example, 1-5 um or below this range, etc.) conductive (for example, Cu) lines within an organic dielectric 320, attached 185 to a laminate 205. Dual RDL interposer structure 300 can include memory components, such as a memory controller chip. In further example embodiments, dual RDL interposer structure 300 can include central processing unit (CPU), graphics processing unit (GPU), etc. In further example embodiments, dual RDL interposer structure 300 can include passive components, such as a capacitor, a resistor, an inductor, etc.

Dual RDL interposer structure 300 can be formed without Bosch etch or deep RIE for the interposer. Dual RDL interposer structure 300 includes a silicon interposer 330 (for example, thinned silicon) with conductive material filled (for example, Cu-filled) vias. Dual RDL interposer structure 300 includes thick wiring 325 that can be used for power-carrying. Power 305 is provided through the laminate 205 to the HBM 350. Power 310 is also provided through the laminate 205 to the accelerator 360. The structure is attached to contact pads 315. The contact pads 315 form a set of device contacts to facilitate connecting devices to form circuits and systems.

Dual RDL interposer structure 300 can include RDL on the interposer back side. In some instances there can be multiple RDL that is split up in groups of chips where inter-chip communication is needed (or is to be implemented). The manufacturer can add multiple inorganic RDL on the interposer top side to facilitate inter-chip communication. Dual RDL interposer structure 300 includes fine wiring for high speed and high bandwidth inter-chip communication, and thicker/wider Cu lines for power delivery and redistribution.

Referring now to FIG. 9 illustrates an example table 400 of expected dimensions for dielectric wet etch, in accordance with example embodiments of the present invention.

As shown in FIG. 9, table 400 includes expected (for example, approximate) dimensions for silicon wet etch for wet etches conducted with an organic hydroxide, tetramethyl ammonium hydroxide (TMAH) and potassium hydroxide (KOH) solutions. KOH and TMAH are anisotropic silicon etches, used to make V-grooves, membranes, and holes through wafers, as well as other devices. In the example embodiments, the wet etch is used to make tetrahedral vias. Other shapes of vias can be formed, for example, hexagonal, etc. In further example embodiments, other wet solutions that lead to anisotropic etching can be implemented.

With regard to the example embodiments, depth of Si etch depends on mask opening width. For example, via depths of 50 to 100 um (micrometers) can be reliably etched with mask critical dimensions (CDs) at about 100 and 150 um, respectively. This method can be used for packaging applications in which a dense pitch arrays of vias is not critical.

Table 400 includes a width of mask opening (um) 410, with a corresponding depth of Si etch (um) 420 and an undercut (um) (with TMAH) 430 and an undercut (um) (with KOH) 440 for different widths of mask opening 410.

For example, for a width of mask opening 25 um, the expected depth of Si etch is 18 um. An undercut of 1 um is expected for TMAH. An undercut of 0.1 um is expected if KOH is applied.

For a width of mask opening 75 um, the expected depth of Si etch is 53 um. An undercut of 4 um is expected for TMAH. An undercut of 0.3 um is expected if KOH is applied.

For a width of mask opening 150 um, the expected depth of Si etch is 105 um. An undercut of 17 um is expected for TMAH. An undercut of 0.6 um is expected if KOH is applied.

The example embodiments described herein provide advantages such as a low cost interposer structure. The low cost interposer structure is fabricated using wet chemistry for etching along natural crystallographic planes. The example embodiments can be implemented using simple lithography.

The BEOL 85 build on top of interposer can be standard fabrication processing used in silicon fabrication (for example, Si fabs). The use of standard fabrication processing for the BEOL 85 build serves to decrease the cost and complexity of fabrication based on the example embodiments. RDL on backside is organic RDL for power distribution. According to example embodiments, the RDL on the backside can be eliminated if power can be delivered directly to the Cu features in the interposer.

The example embodiments achieve fine inter chip communication (fine chip to chip interconnections) as well as power delivery. The example embodiments provide through transmission, and connectivity on top and on other sides.

FIG. 10 illustrates a table 500 comparing various approaches for achieving high density chip-to-chip interconnections in accordance with example embodiments of the present invention.

As shown in FIG. 10, table 500 compares approaches for achieving high density chip-to-chip interconnects. The approaches include using a standard laminate 520, advanced laminates 530, an interposer with through silicon vias (TSVs) 540 and a dual RDL interposer with wet etched vias 550, such as described herein above with respect to FIGS. 1 to 9. Features 510 that can be implemented using the different approaches are shown in the first column of table 500. These features 510 include a line/space (for example, L/S spacing per line) 555, for example, regarding the dimensions of the separation of lines in the structures (therefore smaller line spaces reflecting an increased density), a conductive material (for example, Cu) thickness 560, a μVia diameter 565, a processing location 570 and a power delivery/distribution 575. A μμVia can be a micro via that connects two different levels of metallization in a laminate.

With regard to line/space 555, standard laminates 520 tend to have a line/space 555 in the order of approximately 10 to 15 um L/S. Advanced laminates 530 tend to have a line/space 555 in the order of approximately 2 to 5 um L/S. Interposers with TSVs 540 tend to have a line/space in the order of sub-microns. Dual RDL interposers with wet etched vias 550 tend to have a line/space in the order of sub-microns. As can be seen, the density provided (for example, afforded, etc.) by example embodiments of the dual RDL interposers with wet etched vias 550 is substantially greater (for example, allowing more lines per area) than that of standard laminates 520 and advanced laminates 530 while comparable to interposers with TSVs 540.

With regard to conductive material thickness 560, standard laminates 520 tend to have a conductive material (for example, Cu) thickness 560 in the order of approximately 15 um. Advanced laminates 530 tend to have a conductive material thickness 560 in the order of approximately 2 um. Interposers with TSVs 540 tend to have a conductive material thickness 560 in the order of sub-microns. Dual RDL interposers with wet etched vias 550 tend to have a conductive material thickness 560 in the order of sub-microns. As can be seen, the thickness (or thinness) provided (for example, afforded, etc.) by example embodiments of the dual RDL interposers with wet etched vias 550 is substantially smaller (for example, allowing finer/thinner conductive material) than that of standard laminates 520 and advanced laminates 530 while comparable to interposers with TSVs 540.

With regard to μVia diameter 565, standard laminates 520 tend to have a μVia diameter 565 in the order of approximately 40 to 65 um. Advanced laminates 530 tend to have a μVia diameter 565 in the order of approximately 10 um. Interposers with TSVs 540 tend to have a μVia diameter 565 in the order of sub-micron (between dielectric levels) and approximately 5 to 10 um for the connection to substrate Dual RDL interposers with wet etched vias 550 tend to have a μVia diameter 565 in the order of sub-microns (between dielectric levels) and approximately 25 to 100 um for the connection to substrate. As can be seen, the μVia diameter 565 provided (for example, afforded, etc.) by example embodiments of the dual RDL interposers with wet etched vias 550 is substantially smaller (for example, allowing smaller μVias) than that of standard laminates 520 and advanced laminates 530 while comparable to interposers with TSVs 540.

With regard to processing location 570, standard laminates 520 are processed (for example, fabricated) using non-silicon (non-Si) fabrication at a processing location 570. Processing location 570 indicates one or both of a processing stage and a physical location of fabrication of the device. Si fabrication is usually much more expensive than non-Si fabrication, with the exception of the example embodiments of Si fabrication disclosed herein, which provide a low cost via etching. Non Si fab is any type of chip packaging process (C4, dicing, laminates). Advanced laminates 530 are also processed using non-silicon (non-Si) fabrication. Interposers with TSVs 540 are processed using silicon fabrication (Si Fab). Dual RDL interposers with wet etched vias 550 are processed using silicon fabrication (Si Fab) at a reduced cost due to wet etching. The silicon fabrication with wet etching of dual RDL interposers with wet etched vias 550 provides (for example, affords, etc.) a relatively cheaper (for example, less expensive, less costly, etc.) or reduced cost when compared to interposers with TSVs 540.

With regard to power delivery/distribution 575, standard laminates 520 tend to use RDL for power delivery/distribution 575. Advanced laminates 530 also use RDL for power delivery/distribution 575. Interposers with TSVs 540 use RDL vertically through the TSVs for power delivery/distribution 575. Dual RDL interposers with wet etched vias 550 use RDL vertically through etched lower cost (compared to interposers with TSVs 540) for power delivery/distribution 575.

Dual RDL interposers with wet etched vias 550 have a low cost interposer structure that can be fabricated using wet chemistry for etching along natural crystallographic planes instead of expensive dry reactive ion etching (RIE) as is implemented in interposers with TSVs 540. Dual RDL interposers with wet etched vias 550 can be manufactured using simple lithography. BEOL can be built on top of the dual RDL interposers with wet etched vias 550. This allows fine (sub-micron up to a few microns) dimension BEOL wiring for high density chip interconnections.

Dual RDL interposers with wet etched vias 550 can include an organic RDL on the backside for power distribution. The RDL can be foregone (or eliminated, removed, etc.) in instances in which power is delivered directly to the conductive (for example, Cu) features in the Dual RDL interposers with wet etched vias 550. The Dual RDL interposers with wet etched vias 550 achieve fine (for example, thin lines and high density compared with other structures) inter chip communication as well as power delivery.

With reference to FIG. 9, a flow diagram is shown illustrating a method 700 of forming a dual RDL interposer structure, in accordance with an embodiment.

In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

At block 710, vias (for example, tetrahedron vias, etc.) are etched into a semiconductor (for example, silicon wafer) using wet chemistry. The wet chemistry can be performed using an organic hydroxide, such as tetramethyl ammonium hydroxide (TMAH) and/or potassium hydroxide (KOH) solutions. A thin layer is then formed over etched wafer (such as described with respect to FIG. 1, formation stage 20, herein above).

At block 720, a conductive material (for example, Cu) is deposited. The structure is then electroplated and CMP (for example, damascene) is performed on the conductive material deposit, as described with respect to FIG. 1, fabrication stages 30 and 40 herein above.

At block 730, an inorganic dielectric is added (inorganic RDL) and fine BEOL wiring is formed (for example, created, patterned, etc.). The process is repeated, such as described with respect to FIG. 1, formation stage 60 and FIG. 2, formation stages 80 and 90 herein above.

At block 740, the structure is attached to a first carrier, as described with respect to FIG. 2, fabrication stage 100 herein above.

At block 750, the process includes thinning a backside of structure, as described with respect to FIG. 3 and FIG. 4, fabrication stages 110 to 140 herein above. Thinning of the backside of the structure exposes the conductive material that was previously deposited in the geometrically formed vias.

At block 760, an organic RDL is added to the structure, as described with respect to FIG. 3, fabrication stage 150 herein above. The organic RDL can be placed on a backside of the structure for power distribution.

At block 770, the carrier is removed, the structure is placed on dicing tape, diced, and attached to laminate, as described with respect to FIG. 4, fabrication stages 170 to 200 herein above.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C).

This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A device including a dual redistribution layer (RDL) interposer structure for power-carrying and inter-chip transmission, comprising:
    a silicon interposer structure with vias having sidewalls formed along natural crystallographic planes wherein the vias have a diameter of less than 1 micron;
    a back end of line (BEOL) fine inter-chip wiring with interconnects formed in an inorganic dielectric layer, configured for communication on a top side of the interposer structure, wherein the back end of line (BEOL) fine inter-chip wiring is on a first side of the interposer structure;
    at least one power RDL on a back side of the interposer structure including conductive lines in a dielectric layer, wherein the at least one power RDL is on a second side of the interposer structure opposite the first side;
    at least one memory chip attached to the back end of line (BEOL) fine inter-chip wiring; and
    at least one accelerator chip attached to the back end of line (BEOL) fine interchip wiring, wherein the dual redistribution layer (RDL) interposer structure is configured to provide power to the at least one memory chip and the at least one accelerator chip through the silicon interposer structure, and the at least one memory chip is electrically connected to the at least one accelerator chip through the back end of line (BEOL) fine inter-chip wiring.

2. The device of claim 1,
    wherein the at least one memory chip includes a plurality of memory chips that forms a three dimensional stacked dynamic random access memory (DRAM) component.

3. The device of claim 1, further comprising:
    multiple inorganic RDL on the top side of the interposer structure for inter-chip communication.

4. The device of claim 1, wherein the wet-etched vias comprise tetrahedral vias.

5. The device of claim 1, wherein a thickness of the conductive material is of the order of sub-microns.

* * * * *